United States Patent [19]
Weaver et al.

[11] Patent Number: 5,357,423
[45] Date of Patent: Oct. 18, 1994

[54] APPARATUS AND METHOD FOR AUTOMATICALLY ADJUSTING POWER OUTPUT OF AN ULTRASONIC GENERATOR

[75] Inventors: James M. Weaver, Ambler; Michael J. Sowers, Lansdale, both of Pa.

[73] Assignee: Kulicke and Soffa Investments, Inc., Del.

[21] Appl. No.: 20,367

[22] Filed: Feb. 22, 1993

[51] Int. Cl.⁵ .................... G05B 13/02; H01L 21/607
[52] U.S. Cl. .................... 364/148; 318/116; 310/316; 364/477; 364/481; 228/110.1; 228/1.1
[58] Field of Search .............. 364/148, 477, 481, 482, 364/484, 468; 228/1.1, 110.1; 318/116; 310/26, 316; 156/73.1, 580.1, 73.2–73.4; 264/23; 425/174.2; 128/24 AA, 660.03

[56] References Cited

U.S. PATENT DOCUMENTS

| | | | |
|---|---|---|---|
| 4,970,656 | 11/1990 | Lo et al. | 364/481 |
| 5,046,654 | 9/1991 | Yamazaki et al. | 228/1.1 |
| 5,184,605 | 2/1993 | Grzeszykowshi | 128/24 AA |

*Primary Examiner*—Jerry Smith
*Assistant Examiner*—Steven R. Garland
*Attorney, Agent, or Firm*—John B. Sowell

[57] ABSTRACT

Apparatus and a method for controlling the power output of an ultrasonic generator to a transducer includes a variable impedance network circuit which is interposed between the generator and the transducer. Sensing circuits and a microprocessor are coupled to the input of the transducer so that the total impedance $Z_T$, the transducer impedance in free air $Z_{FA}$ and the load impedance $Z_L$ may be calculated and the network impedance $Z_{NW}$ may be set for a bonding operation to maintain the power level $P_L$ or the impedance $Z_L$ at a desired predetermined level.

13 Claims, 4 Drawing Sheets

APPARATUS AND METHOD FOR AUTOMATICALLY ADJUSTING POWER OUTPUT OF AN ULTRASONIC GENERATOR

BACKGROUND OF THE INVENTION

1. Field of the Invention

The present invention relates to a novel self-adjusting control for power management of an ultrasonic welding system. More particularly, the present invention relates to an improved ultrasonic generator and controller useful in automatic wire bonders for producing consistent wire bonds under different load conditions.

2. Description of the Prior Art

Automatic wire bonders are known and are employed to automatically make fine wire interconnections between pads on a semiconductor chip and the leads of a carrier or lead frame to provide an electrically interconnected semiconductor device. Wires are thermocompression bonded using force and heat and are thermosonically bonded using force, heat and ultrasonic scrub energy. Wire bonds can also be made without using heat by applying force and ultrasonic scrub energy to produce an ultrasonic bond. The predominant method of bonding is known as ball bonding using automatic thermosonic bonding systems. Such systems are made and sold by Kulicke and Soffa Industries, Inc. of Willow Grove, Pa. and have reached a very high degree of computer automation resulting in repeatable accuracy of force and movement of the bonding capillary used to make wire bonds.

Heretofore such automatic wire bonders were provided with ultrasonic generators which produced controlled power to the transducer which holds the bonding capillary that makes the wire bonds. Heretofore transducer power has been controlled by either maintaining constant current ($I_c$) or constant voltage ($V_c$). U.S. Pat. No. 4,808,948 is directed to an automatic tuning system for ultrasonic generators and recognizes that the resonant frequency of a particular ultrasonic transducer which holds the bonding capillary changes its resonant frequency under load and this patent suggests that automatically tuning the voltage control oscillator (VCO) in the phase lock loop will adjust the VCO frequency to the resonant frequency of the transducer. This automatic tuning of ultrasonic generators solves part of the wire bonding problem, however, it did not discuss the problem that the actual power coupled to the bonding target load ($Z_L$) through the wire under the capillary bonding tool varies as a result of such changes.

The present invention starts with the assumption that an optimum condition does not exist from bond to bond, thus, any attempt to set a predetermined optimum fixed power level at the ultrasonic generator will not produce the same $Z_L$ power through the wire that is being bonded.

Heretofore it has been recognized that the power output of the transducer used in an ultrasonic welding system varies from transducer to transducer. Manufacturers of such transducers have attempted to make designs and improve manufacturing methods so that the transducers are more uniform and the impedance and resonant frequency will fall within closely defined specifications. Such attempts to refine the manufacture and specifications of ultrasonic transducers for automatic wire bonders has appreciably increased the cost of manufacturing and quality control inspection.

It is the purpose of the present invention to determine the amount of power that theoretically should be coupled through the wire being bonded and to supply that necessary power to the ultrasonic transducer to produce a desired power level to the load impedance ($Z_L$) at the wire being bonded under varying load conditions at each wire bond. Not only does this approach diminish the need for the small manufacturing differences that are inherent in the systems, but it also strongly diminishes the differences that exist due to load conditions. Heretofore, it was known that the resonant frequency of a transducer varied with the mounting system, the bonding tool, the work holder clamps, roughness, rigidity, coupling ability, transducer temperature, humidity, drift and aging among other conditions. These same conditions also affect the power requirements, thus, it is impossible to predict the power needed as an input to any transducer under load for different wire bond conditions.

It would be desirable to provide an ultrasonic generator/controller that would determine the amount of power needed at the wire being bonded under high speed continuous production conditions and to automatically supply the power needed without interfering with the speed of an automatic wire bonded during production.

SUMMARY OF THE INVENTION

It is a principal object of the present invention to provide a novel ultrasonic power generator system for ultrasonic welding.

It is another principal object of the present invention to provide a novel ultrasonic power generator that automatically adjusts the amount of power output for optimum bonding parameters.

It is another principal object of the present invention to provide a novel controller for an ultrasonic power generator that is capable of sensing the load impedance of an ultrasonic transducer in free air and under load conditions and to adjust the controller's impedance according to the impedance of the transducer under load.

It is another principal object of the present invention to provide a novel controller for sensing impedance variations between different transducers and load circuits and for adjusting the impedance of the controller to match the impedance of the ultrasonic generator.

It is another principal object of the present invention to equalize the impedance of an ultrasonic transducer system which includes variable load impedances during wire bonding.

It is another principal object of the present invention to provide a method of changing the impedance of an ultrasonic transducer system by changing the resistance of a network coupled in series between an ultrasonic generator and an ultrasonic transducer.

It is another object of the present invention to provide a novel ultrasonic generator system for a transducer that is used for automatic wire bonders and which monitors the impedance of the transducer under load during wire bonding.

It is another object of the present invention to provide a controller for an ultrasonic generator that monitors the impedance of a transducer system and automatically makes impedance adjustments for each bond being made by an automatic wire bonder.

It is another object of the present invention to provide a novel controller for an ultrasonic generator that monitors the impedance of the transducer system and automatically produces the same amount of power output at the tip of the capillary of the transducer.

It is another object of the present invention to provide a novel ultrasonic generator/controller system that monitors the value of different impedance components in a transducer wire bonding load circuit and automatically adjusts itself to produce a predetermined power output at the tip of a wire bonding capillary while under a wire bonding load.

It is a general object of the present invention to provide an automatic controller system for an ultrasonic generator/transducer system that automatically adjusts its own impedance to accommodate constantly varying impedance conditions of the transducer circuit and numerous other conditions which cause variations in individual wire bonds on the same device as well as between devices.

It is a general object of the present invention to provide an ultrasonic generator and controller that monitors critical parameters during each wire bonding operation so that the quality of the bonds being made can be compared to a desired standard without actually stopping to test the individual bonds.

According to these and other objects of the present invention there is provided an ultrasonic welding system which includes an ultrasonic generator which supplies ultrasonic power to an ultrasonic transducer. A novel selectable variable resistance circuit is placed in series between the source of ultrasonic power and the transducer under load. A microprocessor is coupled to the ultrasonic generator and to the novel variable resistance circuit and adjusts the resistance thereby producing a predetermined and desired ultrasonic power output at the tip of the bonding tool in the ultrasonic transducer which results in consistent reliable wire bond interconnection.

DESCRIPTION OF THE PREFERRED EMBODIMENT

Figure 1:
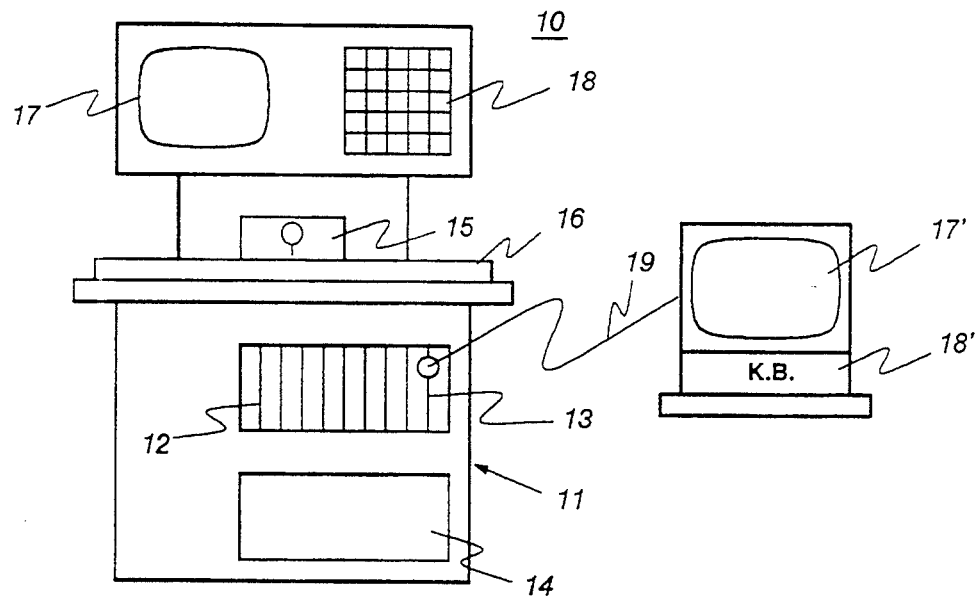
FIG. 1 is a schematic drawing of a prior art automatic wire bonder which incorporates the present invention ultrasonic generator apparatus and further includes a remote manual keyboard controller for test purposes.

Refer now to FIG. 1 showing a schematic block diagram of a automatic wire bonder 10 which includes a computer console 11 and a plurality of control boards 12 which includes an ultrasonic generator (USG) board 13. The console 11 includes most of the electronic and electrical systems for the automatic wire bonder 10 including a power supply 14.

A movable bonding head 15 is mounted for XYZ movement relative to a work station 16 which supports the workpiece and semiconductor devices to be bonded. A monitor 17 is provided for menu and video display and the wire bonder 10 is programmed and controlled by the keypad control 18.

In the present invention, it is desirable to provide a remote control keyboard 18' and remote monitor 17' for diagnostic and testing purposes. The diagnostic keyboard 18' is temporarily coupled to the ultrasonic board 13 via an interface cable connector 19.

Figure 2:
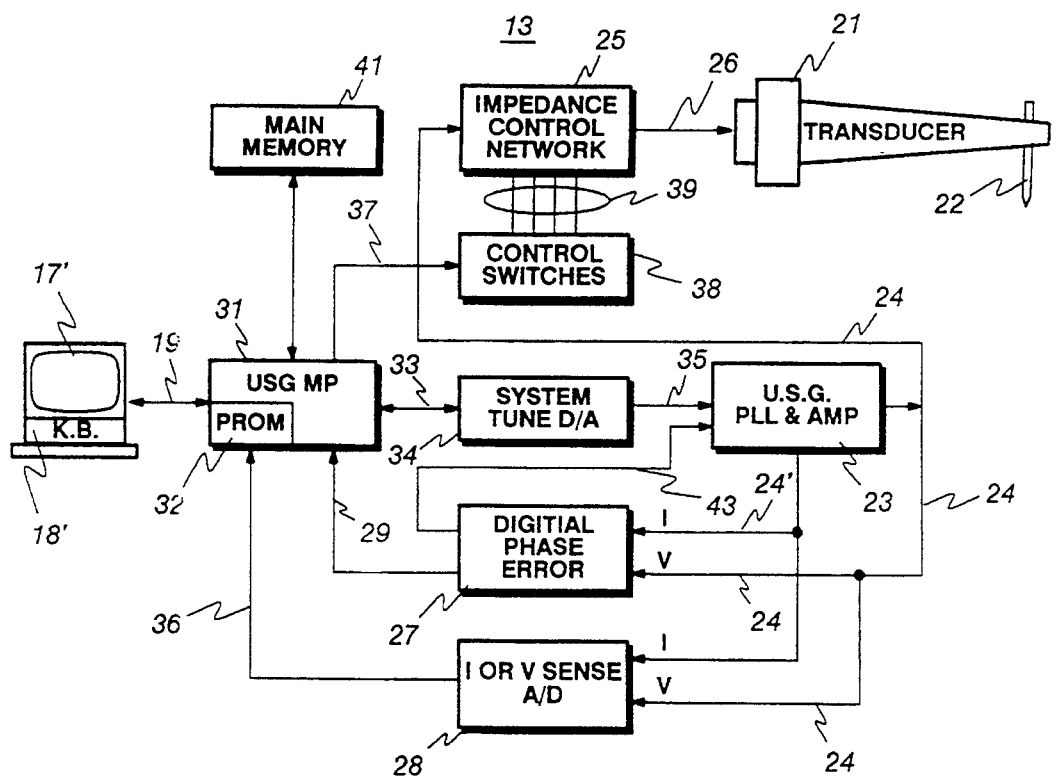
FIG. 2 is a schematic block diagram showing the manual keyboard controller of FIG. 1 coupled to the present invention ultrasonic generator system via a system microprocessor.

Refer now to FIG. 2 showing a schematic block diagram of the novel ultrasonic generator board 13 shown coupled to the remote keyboard control 18' and to a transducer 21 having a capillary bonding tool 22 mounted in the transducer horn. The power to be supplied to the transducer 21 originates in the phase lock loop and amplifier block 23 which is on the board 13. Power generated at block 23 is outputted onto power line 24 and coupled as an input to the impedance control network 25 to be explained in greater detail hereinafter. The power output from network 25 on line 26 is coupled to the transducer 21 and causes the transducer to produce a scrub motion of the bonding tool 22 which is shown in free air and produces an impedance $Z_{FA}$.

The power output on line 24 is applied as an input to a digital phase error sensor 27 and to a current or voltage sensor 28 which includes an analog to digital converter. The output of the digital phase error sensor 27 on line 29 is coupled as an input to the ultrasonic generator microprocessor block 31 shown having its own programmable ROM memory 32. The phase error on line 29 is employed by the microprocessor block 31 to generate commands on line 33 to adjust the system oscillator frequency (tuning) in block 34. The output signal from block 34 on line 35 is applied to the phase lock loop block 23 as a desired frequency signal or nominal frequency signal to be processed in block 23 which completes the phase lock loop.

The output from the voltage or current sensor 28 on line 36 is also applied to the ultrasonic generator microprocessor block 31 which processes the information and produce the desired impedances for the system as will be explained in greater detail hereinafter. The processed information is used to apply control signals via line 37 to the control switches 38 which are coupled to the impedance control network 25 by a plurality of lines 39. In the preferred mode of operation, the impedance control network 25 will insert in series a predetermined resistive impedance between the power supply line 24 and the output line 26 which is coupled to the transducer 21.

In the preferred embodiment of the present invention, the automatic wire bonder 10 is provided with a large amount of main memory 41 which may be shared by the ultrasonic generator block 31.

Figure 3:
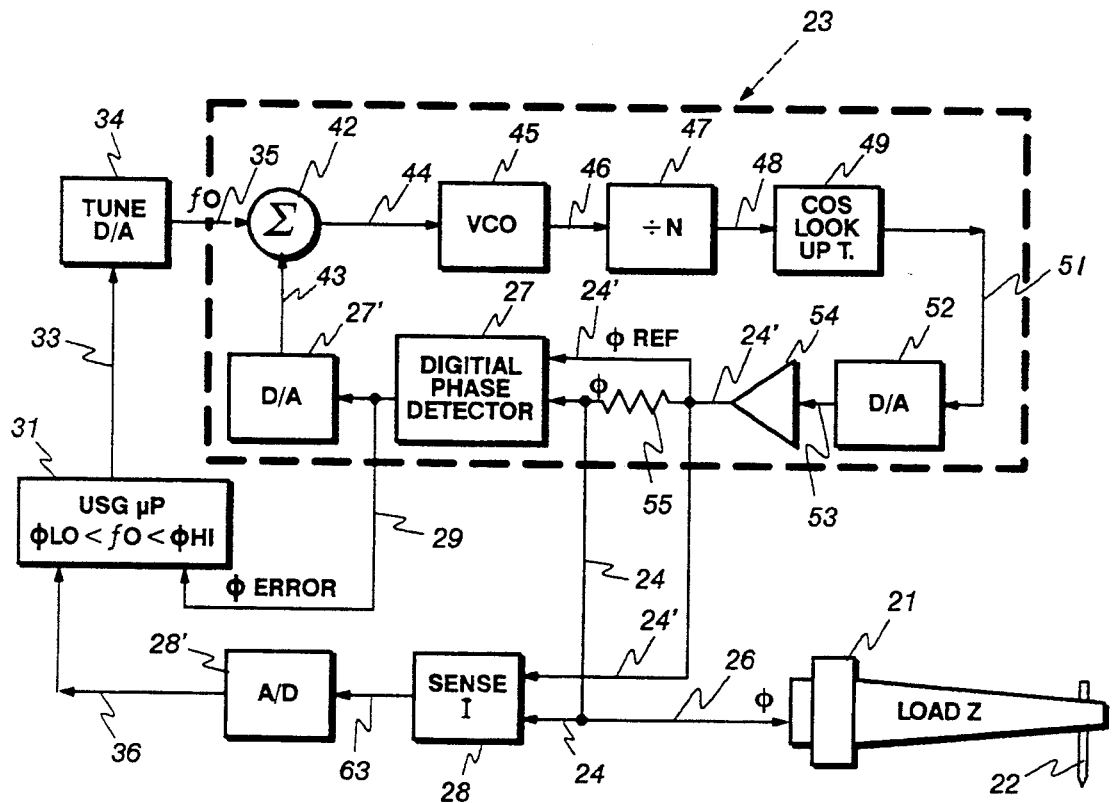
FIG. 3 is more detailed schematic block diagram of the phase lock loop portion of the ultrasonic generator and amplifier shown in FIG. 2.

Refer now to FIG. 3 showing a more detailed schematic block diagram of the phase lock loop and amplifier block 23 coupled to the transducer 21 and other block elements of FIG. 2. The typical phase lock loop 23 comprises a summing circuit 42 having a desired frequency input on line 35 from the tuning circuit 34 and a second input on line 43 from the digital to analog convertor 27' which is part of the digital phase error detector 27 which produces the output on line 29 shown as a phase error input to the ultrasonic generator microprocessor block 31. The block 31 is shown coupled to the tuning circuit 34 via line 33 as previously shown in FIG. 2.

A voltage output on line 44 from summing circuit 42 is applied as a voltage correcting signal to the voltage control oscillator 45. The frequency output on line 46 from the voltage controlled oscillator is applied to a dividing circuit 47 which steps the frequency down on output line 48 which is applied to the input of a lookup table counter 49 to produce digital amplitude data signals on line 51 which are applied to the digital to analog convertor 52. The analog signal output from block 52 on line 53 is applied to power amplifier 54 which produces the aforementioned current signal on output line 24'. The current signal on line 24' is applied to a sensing resistor 55 to produce the aforementioned voltage signal on line 24 which is applied to blocks 27 and 28, both of which are shown separated into two units 27' and 28'. The output of the sensing circuit 28 on line 36 is shown applied as an input to the microprocessor block 31. Line 24 is shown broken at the input line 26 to the transducer 21, because the network 25 is not shown.

Figure 4:
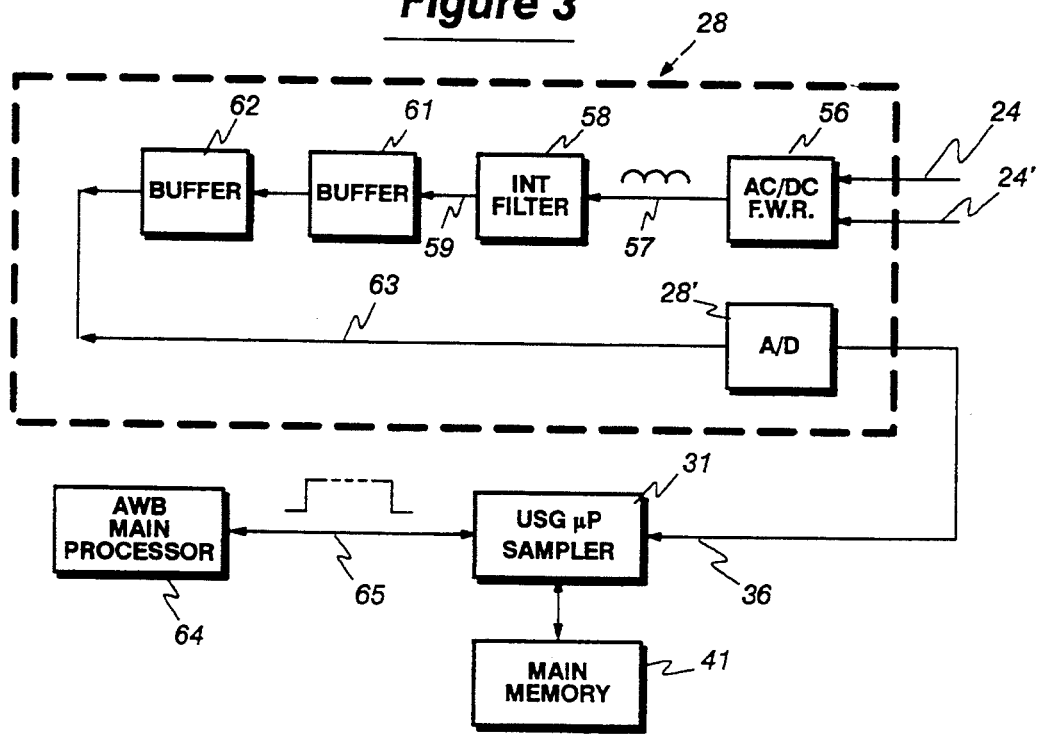
FIG. 4 is a more detailed schematic block diagram of the sensing circuit shown in FIG. 2.

Refer now to FIG. 4 showing a more detailed schematic diagram of the sensing circuit 28. The current and voltage inputs on lines 24 and 24' are shown applied to an AC to DC full wave rectifier circuit 56 which produces a full wave rectified voltage output on line 57. The voltage on line 57 is applied through an integrating filter 58 to produce on line 59 a voltage signal that is proportional to the current flowing through the transducer 21. The desired signal on line 59 is sent through buffers 61 and 62 and the resulting signal on line 63 is applied to the aforementioned analog to digital converter 28' to produce the digital current value on line 36 which is applied as an input to the ultrasonic generator microprocessor 31. The ultrasonic generator microprocessor 31 is shown coupled to the aforementioned main memory 41 and to the automatic wire bonder main processor 64 which is located on one of the control boards 12 of the console 11. The main processor 64 is coupled by a bidirectional cable 65 to the microprocessor 31 and controls the operation of the USG and allows reporting of sample data information via line 65.

Figure 5:
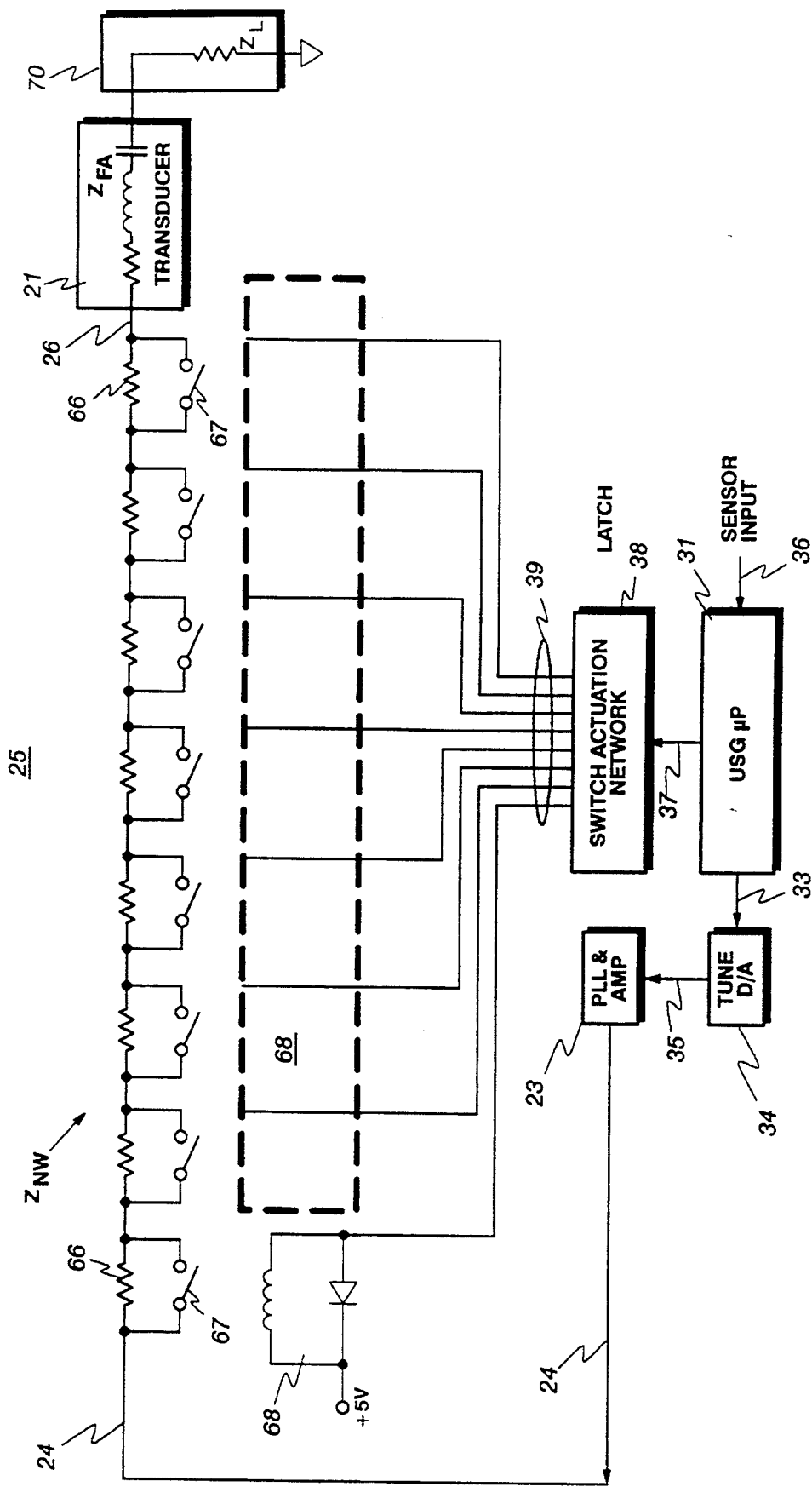
FIG. 5 is a more detailed schematic block diagram of the impedance control network shown in FIG. 2.

Refer now to FIG. 5 showing a more detailed schematic block diagram of the impedance control network 25 shown in FIG. 2. The power for the transducer 21 is produced at the amplifier block 23 and provided as an input on line 24 to the impedance network 25 ($Z_{NW}$). The impedance network 25 comprises a plurality of resistors 66 having values that are a power of 2 of its adjacent resistor, thus providing a variable resistance from zero to 255 ohms in one ohm increments. In the preferred embodiment of the present invention, the resistors 66 are normally in the circuit in series between lines 24 and 26 and are shunted or bypassed by the contacts 67 of the relays 68 under the control of the switching network 38 which is further controlled by the microprocessor 31. The transducer impedance ($Z_T$) comprises three components shown as a resistance and inductance and capacitance in block 21. Further, the load impedance ($Z_L$) is shown modeled as a resistance ($Z_L$) but actually has negligible components of inductance and capacitance. The microprocessor 31 shown having a sensor input 36 which was shown in greater detail in FIG. 3. The sensor input supplies the microprocessor with the current and voltage information necessary for the microprocessor to compute the impedance seen at line 26 which comprises the combination of $Z_T$ and $Z_L$. When there is no load on the capillary bonding tool, the transducer's load $Z_L$ is equal to zero and the value computed and sensed by the microprocessor 31 comprises only the transducer impedance $Z_T$. This no load value is noted hereinafter as the impedance $Z_{FA}$ or the transducer impedance in free air. As a result of the computations of $Z_T$, $Z_L$ and $Z_{FA}$, the computer 31 issues a command on line 37 to the switch actuation network 38 to close individual relay contacts 67 to insert a predetermined and desired resistance $Z_{NW}$ in series between line 24 and line 26 as will be explained in greater detail hereinafter. The blocks 23 and 34 which are in series between the microprocessor 31 and line 24 are shown and operate the same as discussed and explained hereinbefore with reference to FIG. 3.

Figure 6:
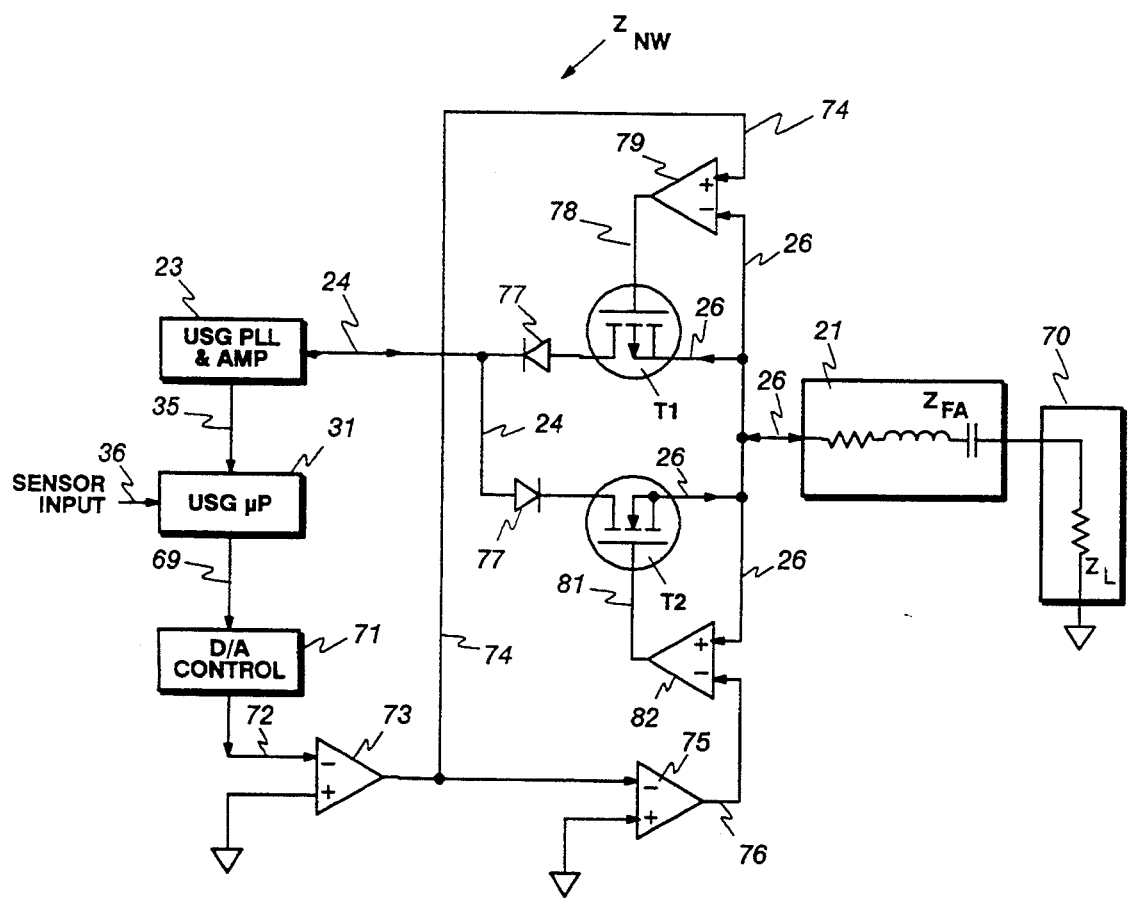
FIG. 6 is a schematic block diagram showing a solid state continuously variable resistance circuit which operates on the linear portion of the solid state current or voltage curves to produce a variable resistance.

Refer now FIG. 6 showing a schematic circuit diagram of a solid state impedance circuit which provides continuous variable resistance between the line 24 and line 26 and comprises a modification or improvement of the basic invention explained with reference to FIG. 5.

The power to the modified switching network $Z_{NW}$ is supplied from the phase lock loop and amplifier block 23 to line 24 as previously described. The microprocessor 31 is shown coupled to the block 23 and to a digital to analog controller 71 via line 69. The output of the controller 71 on line 72 is coupled to the negative input of a inverting amplifier 73 and the output of the inverting amplifier 73 is coupled via line 74 to the input of a second inverting amplifier 75 which provides output similar to the input on line 72 as an input to the N channel control amplifier 82. Also the line 74 is coupled to the positive input of the P channel control amplifier 79 which produces an output 78 coupled to the gate of the P channel mosfet transistor T1. Similarly, the output of amplifier 82 is coupled to the gate of the N channel mosfet transistor T2 via line 81. When an alternating current or voltage is provided on line 24, the steering diodes 77 in conjunction with the control amplifiers 79 and 82 operate the P and N channel transistors T1 and T2 to provide a variable resistance for the alternating current on line 24. Thus, the microprocessor 31 can provide a predetermined resistance value on line 69 in digital form which causes the gate signals on line 78 and 81 to adjust the transistors T1 and T2 throughout their linear range and provide a linear range of resistance from zero through a value approaching infinite resistance. As explained hereinbefore, the sensor input on line 36 to the microprocessor 31 provides the necessary raw information to compute the value of the impedance $Z_{NW}$ to be inserted between lines 24 and 26 by computing the impedance $Z_T$ and $Z_L$ shown as block 70 in FIGS. 5 and 6.

Having explained the impedance network circuits and their operation in the ultrasonic generating system 13, it will be understood that the novel circuits may be operated in more than one preferred mode of operation. Before explaining these examples, it is to be noted that the value of $Z_T$ will vary from 10 to 60 ohms in free air. The value of $Z_T$ plus $Z_L$ will vary from 10 to 300 ohms under load. The value of Q which is ratio of energy stored to energy delivered varies from 50 to 5,000 and is unitless. The value of the nominal center frequency of the transducer varies from 59.75 to 60.3 kilohertz when the Q value is equal to 350. Thus, approaches a nominal value of center frequency of 60 kilohertz.

By definition the load impedance $Z_L$ is equal to zero in free air. The total impedance $Z_T$ in free air is equal to $Z_{FA}$ when the value of $Z_{NW}$ is equal zero. The impedance $Z_{NW}$ of the network is equal to the value determined and set by the microprocessor network 31. The impedance in free air $Z_{FA}$ is equal to the impedance of the transducer 21 when the value of $Z_{NW}$ is equal to zero. The load impedance $Z_L$ under load is equal to the impedance added due to the bonding operation. The value V for constant voltage control is taken at the output of the phase lock loop 23. The value I for current control is taken as the current input to the transducer 21.

Before explaining the examples or modes of operation to be used it will be understood that when using any one of the following modes of operation, the $Z_{FA}$ of the transducer and the $Z_T$ are known values at the microprocessor 31. Further, during a teach operation when actual bonding is taking place, the value of $Z_L$ is calculated for each bond at the actual bonding locations on a chip.

Using the above defined values, it is now possible to write equations for $Z_T$, $Z_{FA}$ and $Z_L$ under two different types of conditions.

Having explained the conditions precedent, the six preferred modes of operation are as follows:

MODE 1 (Constant $Z_{NW}$)

S1. Assume some information is known which permits the operator to set a constant $Z_{NW}$ value for all bonds or groups of bonds.

S2. Optionally compute $Z_L$ and $Z_T$ for each bond to make future adjustment to $Z_{NW}$.

MODE 2 (Manual impedance matching)

S1. Operator manually enters one desired $Z_T$ for all bonds or groups of bonds.

S2. Computer measures $Z_{FA}$ for the system.

S3. The computer calculates a $Z_{NW}$ for each bond where $Z_{NW}=Z_T-Z_{FA}$. S4. The bonder employs the calculated $Z_{NW}$ for each bond on all subsequent devices so that $Z_T$ remains constant.

MODE 3 (Source/Load impedance matching)

S1. Set $Z_{NW}$ to zero and determine $Z_{FA}$,

S2. Bond a device and determine a $Z_L$ at each bond.

S3. Calculate $Z_{NW}=Z_L-Z_{FA}$ for each bond.

S4. Insert the calculated value of $Z_{NW}$ in series with the transducer at each bond.

MODE 4 (Constant $Z_T$ during bonding)

S1. Operator selects a desired $Z_T$ for the $\mu P$ to use as a constant.

S2. Bond a device and determine $Z_L$ at each bond.

S3. Calculate $Z_{NW}=Z_L-Z_{FA}-Z_L$ for each bond.

S4. For each bond change $Z_{NW}$ such that $Z_T$ is constant and $Z_L=Z_{FA}+Z_{NW}+Z_T$.

MODE 5 (Constant power to the load)

S1. Bond a device and determine $Z_L$ for each bond.

S2. Assume system voltage V remains constant over a time period.

S3. Operator enters or has entered a power level $P_L$ for each bond where $P_L=I^2Z_L$ and $I=P_L/Z_L$.

S4. Computer calculates a value of $Z_{NW}$ at each bond so that $Z_{NW}=V/I-Z_{FA}-Z_L$.

S5. Change $Z_{NW}$ for each bond so that power to the load $P_L$ remains constant.

MODE 6 (Test mode using sensed data)

S1. Install a previous measured device in an automatic wire bonder to be tested. Assume a device $Z_L$ is known.

S2. Perform simulated bond operations on a plurality of similar device sites.

S3. Monitor and record data for I, $F_O$, $Z_L$, $Z_{FA}$, $Z_T$ and phase $\phi$ for groups of similar bond sites.

S4. Statistically plot and analyze data versus bond positions and determine if the generator system is performing within acceptable limits.

Having explained five operational modes and one test or calibration mode, it will be apparent that individual steps of any of the modes may be interchanged to create a greater number of modes that are more sophisticated than the basic modes explained above.

What is claimed is:

1. Apparatus for adjusting the power output of an ultrasonic generator to a transducer comprising:
    an ultrasonic power generator,
    a variable impedance network coupled to the output of said ultrasonic power generator,
    an ultrasonic transducer coupled to the output of said variable impedance network,
    said variable impedance network comprising a variable impedance transistor circuit coupled in series between the output of said ultrasonic power generator and the input to said ultrasonic transducer,
    microprocessor means coupled to said ultrasonic power generator and to said variable impedance network,
    means for sensing current and voltage values at the output of said ultrasonic power generator coupled to said microprocessor means, and
    control means coupled to said microprocessor means and to said variable impedance network for setting a predetermined impedance in series between said ultrasonic power generator and said ultrasonic transducer.

2. Apparatus as set forth in claim 1 wherein said control means comprises a manually operable keypad for entering data into said microprocessor.

3. Apparatus as set forth in claim 1 wherein said control means comprise a manually operable keyboard for selecting one of a plurality of automatic modes of operation.

4. Apparatus as set forth in claim 1 wherein said control means comprise a plurality of transistors each having control electrodes and amplifier means coupled to the control electrodes of each of said transistor for varying the series impedance of said transistors and said variable impedance network.

5. Apparatus as set forth in claim 4 wherein said plurality of transistors comprise an N channel and a P channel field effect transistor arranged as a push-pull pair for controlling alternating current supplied to said ultrasonic transducer.

6. A method of controlling the power delivered to a bonding tool during a bonding operation, comprising the steps of:
    connecting a variable impedance network comprising resistance components connected in series between an ultrasonic power generator and an ultrasonic transducer of the type adapted to hold a bonding tool,
    providing a microprocessor for controlling the output of said ultrasonic generator and said variable impedance network,
    sensing the output values of said ultrasonic generator coupled to said ultrasonic transducer to determine the bonding load,
    controlling the value of said variable impedance network in a preferred mode of operation by,
    calculating a predetermined desired network impedance ($Z_{NW}$) to be inserted in series between said ultrasonic power generator and said ultrasonic transducer for a bonding operation to deliver a predetermined amount of power through said ultrasonic transducer, and switching said desired network impedance ($Z_{NW}$) value in series between said ultrasonic power generator and said ultrasonic transducer before a bonding operation.

7. The method as set forth in claim 6 wherein said step of sensing the output of said ultrasonic generator comprises sensing the voltage, current and phase difference.

8. The method as set forth in claim 6 wherein said step of controlling said variable impedance network comprises calculating the impedance of said transducer in free air ($Z_{FA}$) and the impedance of said transducer under bonding load ($Z_L$).

9. The method as set forth in claim 6 wherein said step of controlling said variable impedance network comprises changing the network impedance ($Z_{NW}$) for individual bonds.

10. The method as set forth in claim 6 wherein said step of calculating a desired network impedance ($Z_{NW}$) includes the step of maintaining a constant load impedance $Z_L$ during bonding operations.

11. The method as set forth in claim 6 wherein said step of calculating a desired network impedance $Z_{NW}$ includes the step of maintaining a constant total impedance $Z_T$ where $Z_{NW}=Z_T-Z_L$.

12. The method as set forth in claim 6 wherein said step of calculating a desired network impedance $Z_{NW}$ includes the step of maintaining a constant power level $P_L$ for bonds where $P_L$ is equal to the product of the current $I^2$ and the load impedance $Z_L$.

13. Apparatus for adjusting the power output of an ultrasonic generator to a transducer comprising:

an ultrasonic power generator, a variable impedance network coupled to the output of said ultrasonic power generator, an ultrasonic transducer coupled to the output of said variable impedance network, said variable impedance network comprises a plurality of resistors coupled in series and operably selected or bypassed by relays operated by a switch actuation network, microprocessor means coupled to said ultrasonic power generator and to said variable impedance network, means for sensing current and voltage values at the output of said ultrasonic power generator coupled to said microprocessor means, and control means coupled to said microprocessor means and to said variable impedance network for setting a predetermined impedance in series between said ultrasonic power generator and said ultrasonic transducer.

* * * * *